United States Patent
Erickson et al.

(10) Patent No.: US 6,807,052 B2
(45) Date of Patent: Oct. 19, 2004

(54) CONFIGURABLE BRACKET FOR MOUNTING ELECTRONIC DEVICES

(75) Inventors: Vernon D. Erickson, Dakota Dunes, SD (US); David R. Davis, Jefferson, SD (US)

(73) Assignee: Gateway, Inc., Poway, CA (US)

( * ) Notice: Subject to any disclaimer, the term of this patent is extended or adjusted under 35 U.S.C. 154(b) by 201 days.

(21) Appl. No.: 10/106,715

(22) Filed: Mar. 26, 2002

(65) Prior Publication Data

US 2003/0184959 A1 Oct. 2, 2003

(51) Int. Cl.$^7$ ................................................ G06F 1/16
(52) U.S. Cl. .................... 361/683; 361/759; 361/801; 361/686; 361/825
(58) Field of Search ............................ 361/683, 801, 361/754, 825, 682, 686, 759, 740, 732, 726, 747, 752

(56) References Cited

U.S. PATENT DOCUMENTS

| | | | |
|---|---|---|---|
| 3,603,845 A | 9/1971 | Beers | 317/117 |
| 3,640,399 A | 2/1972 | Hartman | 211/175 |
| 4,462,499 A | 7/1984 | Calabro | 211/41 |
| 5,457,608 A | 10/1995 | Scholder et al. | 361/752 |
| 5,603,628 A | 2/1997 | Schapiro, Jr. | 439/327 |
| 5,642,264 A | 6/1997 | Cantrell | 361/802 |
| 5,706,173 A | 1/1998 | Carney et al. | 361/740 |
| 5,909,359 A | 6/1999 | Summers et al. | 361/748 |
| 6,021,049 A | 2/2000 | Thompson et al. | 361/759 |
| 6,174,189 B1 | 1/2001 | Kuo et al. | 439/327 |
| 6,424,521 B1 * | 7/2002 | Vega et al. | 361/683 |

* cited by examiner

Primary Examiner—Tulsidas Patel
Assistant Examiner—Hung S. Bui
(74) Attorney, Agent, or Firm—Chad Swantz Suiter - West

(57) ABSTRACT

The present invention is directed to a configurable bracket. A configurable bracket for mounting an electronic device within a chassis of an information handling system may include a bracket adapted for mounting in a first chassis configuration, the bracket including at least one connection portion suitable for connecting an electronic device to the bracket. An extension is also included, the extension suitable for extending said bracket for mounting in a second chassis configuration.

16 Claims, 5 Drawing Sheets

CONFIGURABLE BRACKET FOR MOUNTING ELECTRONIC DEVICES

FIELD OF THE INVENTION

The present invention generally relates to the field of information handling system, and particularly to a configurable bracket.

BACKGROUND OF THE INVENTION

Information handling system may be configured for a wide variety of applications. From office use as a desktop system, tower system and the like, to household use, such as a convergence system, game console, audio system, and the like, there are a wide range of functions desired by users of information handling systems.

To provide this wide range of functionality, information handling systems may be specially configured for the contemplated uses. For instance, various electronic devices may be included within a chassis of the information handling system to provide the functions, such as peripheral devices, video adapters, modems, sound cards, and the like. To connect the devices, a bus may be included within the information handling system that has an architecture suitable for communicatively coupling to devices configured for that architecture. Therefore, a wide range of devices may be employed by an information handling system that comply with an industry standard specification.

Such a standardized specification has enabled providers of devices for information handling systems an architecture for providing the device to a wide range of information handling systems. However, as the range of uses for information handling systems has grown, the choices for an architecture and specification to enable these uses has also grown.

Therefore, it would be desirable to provide a bracket suitable for converting between electronic device architecture and specifications.

SUMMARY OF THE INVENTION

Accordingly, the present invention is directed to a configurable bracket. In a first aspect of the present invention, a configurable bracket for mounting an electronic device within a chassis of an information handling system includes a bracket adapted for mounting in a first chassis configuration, the bracket including at least one connection portion suitable for connecting an electronic device to the bracket. An extension is also included, the extension suitable for extending said bracket for mounting in a second chassis configuration.

In a second aspect of the present invention, an apparatus includes a configurable bracket suitable for attaining a first position and a second position. The first position is suitable for mounting an electronic device in accordance with a PCI specification and the second position is suitable for mounting an electronic device in accordance with a low profile PCI specification.

In a third aspect of the present invention, a configurable bracket for mounting an electronic device within a chassis of an information handling system includes a bracket adapted for mounting in a first chassis configuration and a means for extending connected to the bracket. The bracket includes at least one connection portion suitable for connecting an electronic device to the bracket. The extending means is suitable for extending said bracket for mounting in a second chassis configuration.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 5, exemplary embodiments of the present invention are shown. Various electronic devices may be included within a chassis of the information handling system to provide a wide variety of functions. To enable interoperability of devices across systems, specifications are provided to enable manufacturers of devices and of information handling systems a commonality for device configuration. However, as the range of uses for information handling systems has grown, various specifications have been developed to optimize these desired uses.

Therefore, a device which previously was interoperable across a wide range of systems may have such interoperability limited by different specifications. For example, a manufacturer of an information handling system desiring to employ a device may have to modify the device for the desired specification. Such a modification may be time consuming and expensive, thereby increasing the costs of the information handling system. The present invention provides a bracket capable of attaining positions for mounting devices in compliance with various standards, such as at least two specifications.

Figure 1:
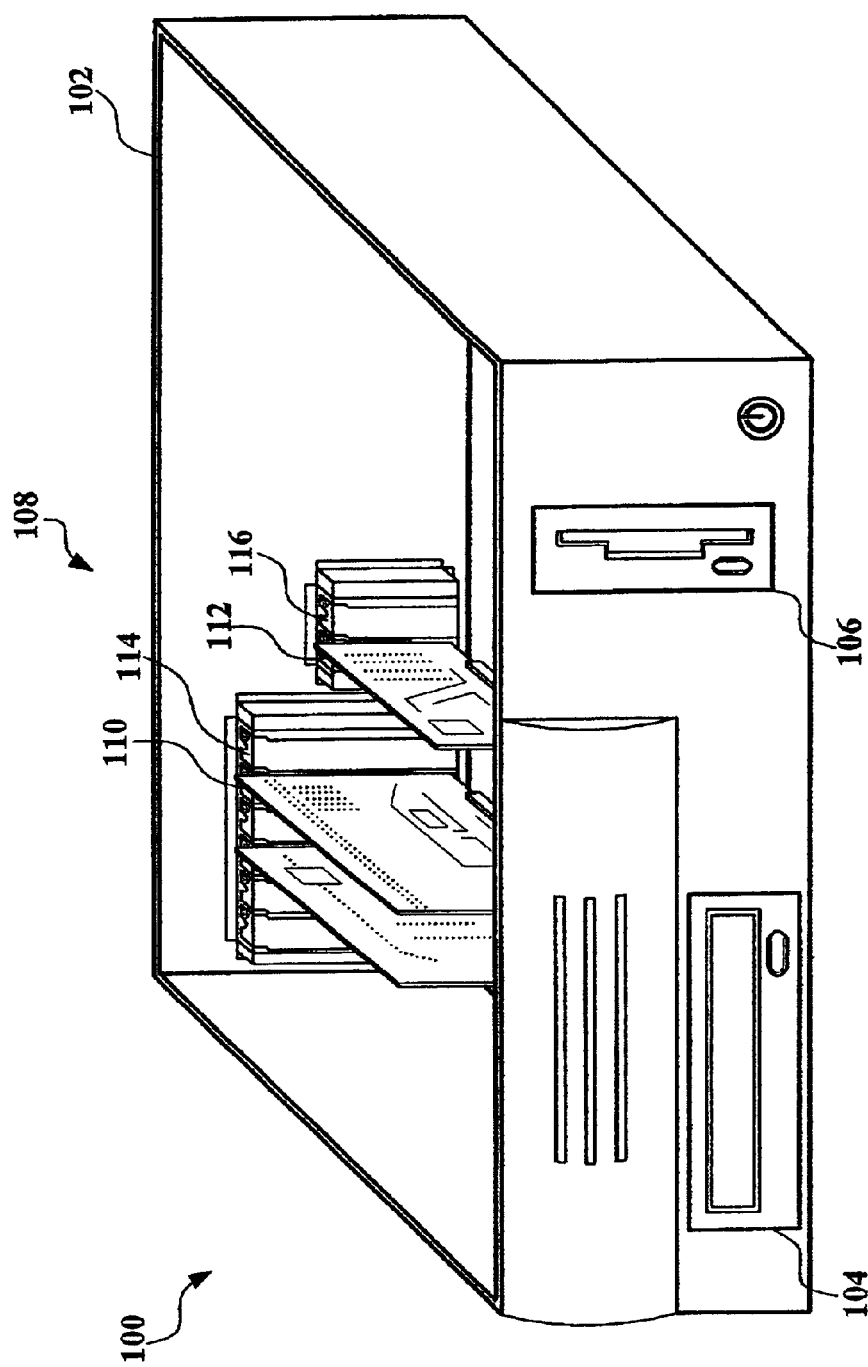
FIG. 1 is an illustration of an embodiment of the present invention in which an information handling system chassis is configured in accordance with a specification for mounting electronic devices.

Referring now to FIG. 1, an embodiment 100 of the present invention is shown wherein a chassis of an information handling system is configured in accordance with a specification for mounting electronic devices. A chassis may receive a variety of electronic devices, such as a CD-ROM 104, floppy disk drive 106, DVD player, and the like. Additionally, the chassis 102 may include a plurality of connectors 108 configured in accordance with design specifications for accepting electronic devices, such as video display cards, sound cards, modems, network connection devices, and the like as contemplated by a person of ordinary skill in the art.

However, as previously described, a variety of design specifications may be utilized for connecting a device to a chassis of an information handling system. For example, a first design specification may involve a PCI card of typical dimensions, while a second specification may involve a low profile PCI card. To mount devices in accordance with these specifications, different brackets may be utilized to mount the device to the chassis of the information handling system.

Figure 2A:
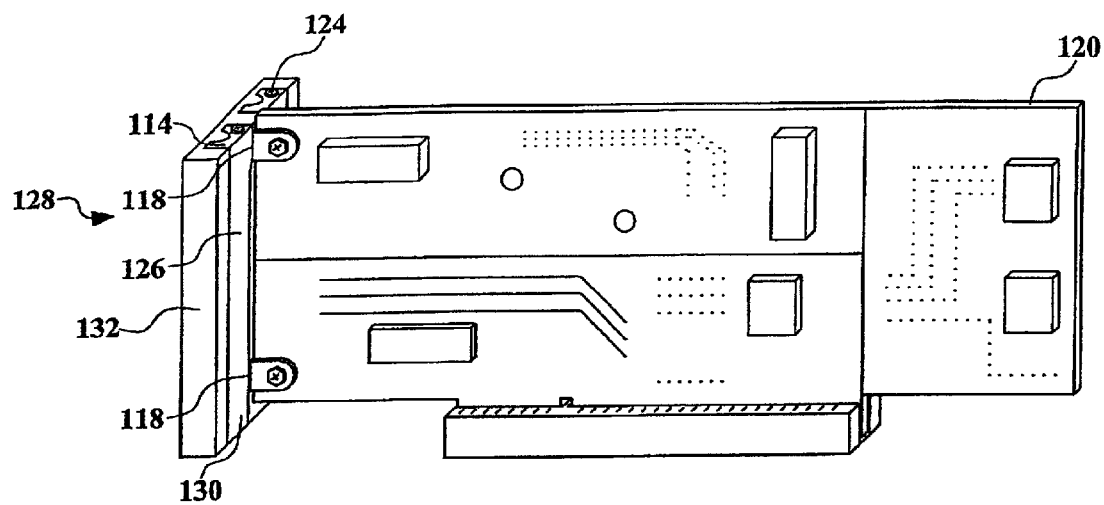
FIG. 2A is a side view of an embodiment of the present invention in which a bracket is configured for use with a PCI specification for electronic devices.
Figure 2B:
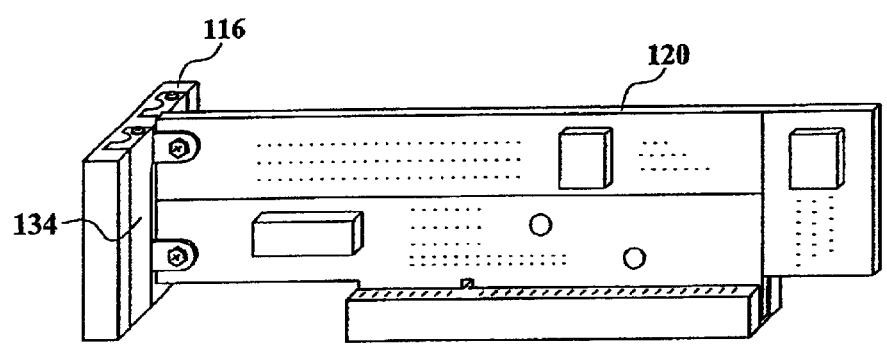
FIG. 2B is a side view of an embodiment of the present invention wherein a bracket is configured for use with a low profile PCI specification.

For example, referring now to FIGS. 2A and 2B, brackets configured for use with different specifications are shown. In FIG. 2A, a first bracket 114 is configured for use with a PCI specification for electronic devices. The bracket 114 includes connectors 118 for mounting a circuit board to a chassis 102 (FIG. 1). The bracket 114 is sized so that it may be attached to a receiving mechanism of the chassis 102, such as through the use of a screw 122 through an opening 124 disposed on a first end 128 of a bracket member 126. A tab 130 is disposed on a second end 132 opposite of the first end 128 of the bracket member 124. This way, the bracket 114 may be secured to the chassis 102 (FIG. 1) and thus secure the printed circuit board 120.

In FIG. 2B, a second bracket 116 is provided as configured for use with a low profile PCI specification. To comply with the specification, the second bracket 116, and specifically the bracket member 134, may be of a reduced length than the bracket member 126 of the bracket 114 shown in FIG. 2A. Such a configuration may be desirable in space saving instances of information handling system construction. However, the first bracket 114 and the second bracket 116 may not be interchangeable, therefore requiring a manufacturer of an information handling system to switch brackets depending on the configuration. This may involve manually removing two screws from a circuit board, and then replacing the screws when attaching to a desired bracket.

Figure 3:
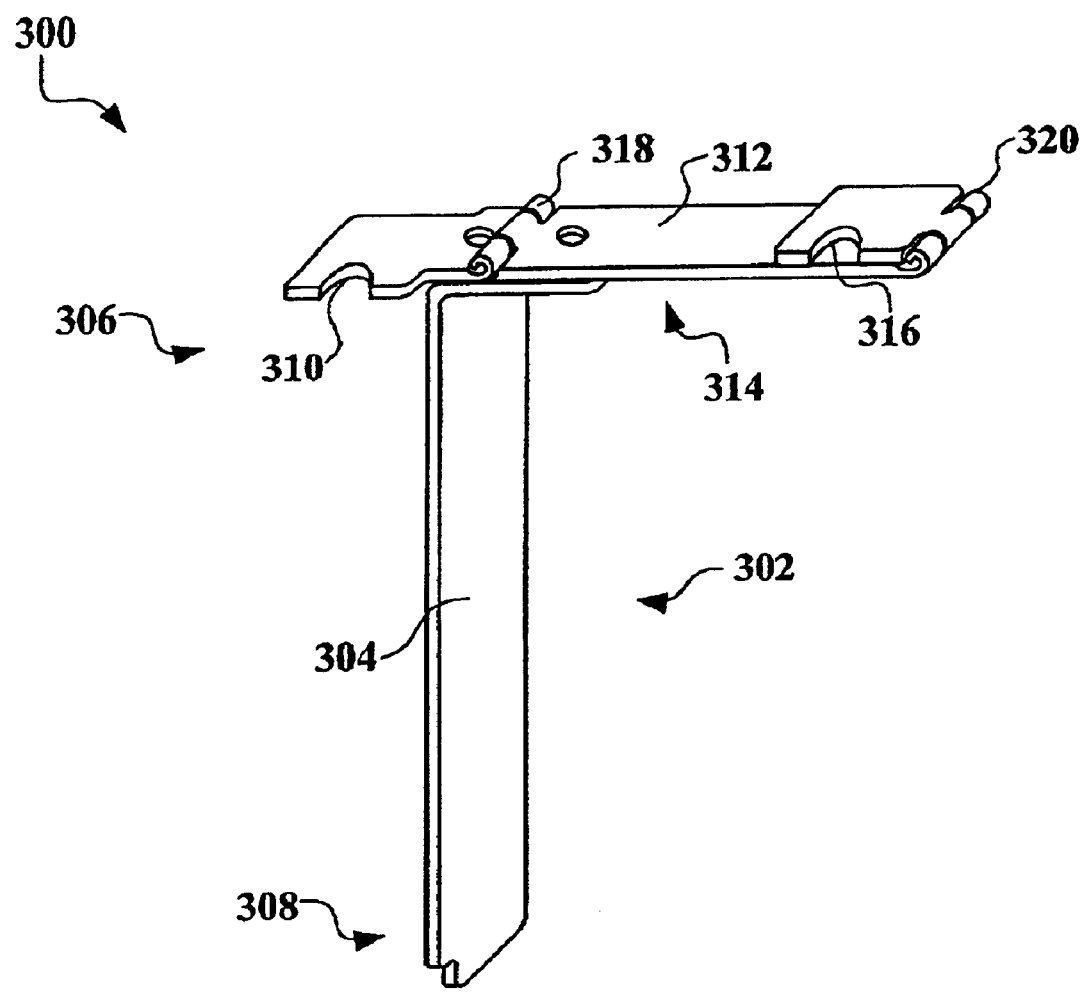
FIG. 3 is an isometric view of an embodiment of the present invention in which an exemplary configurable bracket is shown.

Referring now to FIG. 3, an illustration of an embodiment 300 of the present invention is shown wherein a configurable bracket suitable for attaining configurations in compliance with at least two specifications is shown. A configurable bracket 302 includes a bracket member 304 having a first end 306 and a second end 308. The first end 306 includes a first extension 308 disposed generally perpendicular to the bracket member 304. The first extension 308 includes an opening 310 suitable for receiving a screw for attaching the bracket 302 to a chassis 102 (FIG. 1) of an information handling system. In this instance, the bracket member 304 is sized to conform to a first specification, such as LP-PCI.

The bracket 302 also includes second extension 312. The second extension 312 may include a third extension 314 including an opening 316 suitable for receiving a screw for attachment of the bracket 302 to a housing 102 (FIG. 1) of an information handling system. The second extension 312 is formed of a sufficient length, so that when positioned in conjunction with the bracket member 304, the bracket complies with a second specification, such as PCI. For instance, the bracket member 304 may be formed with a length in compliance with LP-PCI, while the second and third extensions are used in conjunction with the bracket member to configure the bracket to comply with the PCI specification.

To enable quick and easy conversion between a first position suitable for a first specification and a second position suitable for a second specification, hinges may be included. For instance, a first hinge 318 may be disposed between the first extension 310 and the second extension 312. The hinge 318 enables the second extension to rotate between a first position that is generally aligned to the first extension 310, and shown in FIG. 3, and a second position which is generally aligned with the bracket member 406, as shown in FIG. 4B. The first position of the second extension provides the additional advantages of protecting a circuit board from falling objects. For instance, items dropped into a chassis, loose items with the chassis, and the like may be deflected by the second extension from contacting the electronic device mounted to the configurable bracket.

Additionally, a second hinge 320 may be provided between the second extension 310 and the third extension 314. By providing the second hinge 320, the third extension 314 may be stored generally parallel with the second extension 312 for storage of the third extension 314 when the bracket 302 is being utilized in the first configuration. Thus, when the bracket 302 is used in the second configuration, the third extension 314 may be rotated in position to attach to the chassis 102 of the information handling system as shown in FIG. 1.

Figure 4A:
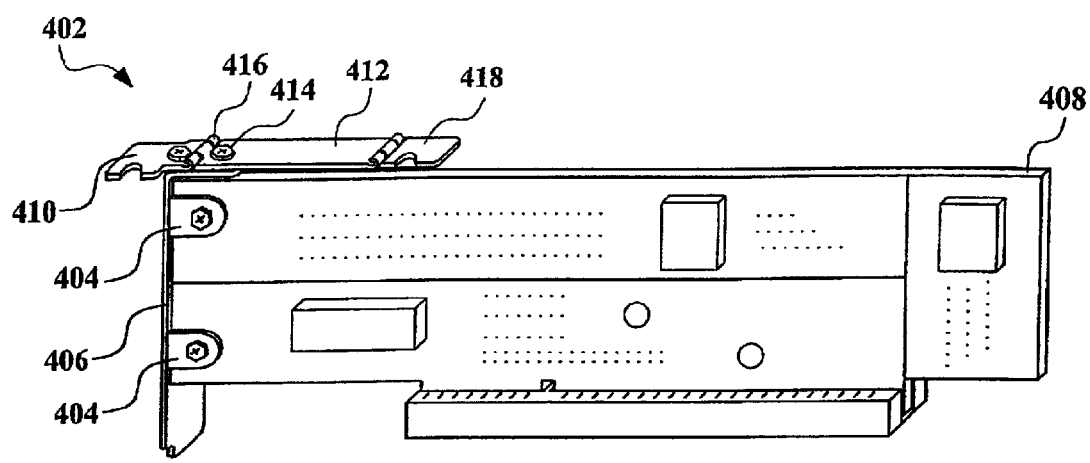
FIG. 4A is a side view of the configurable bracket shown in FIG. 3 arranged in a first configuration.
Figure 4B:
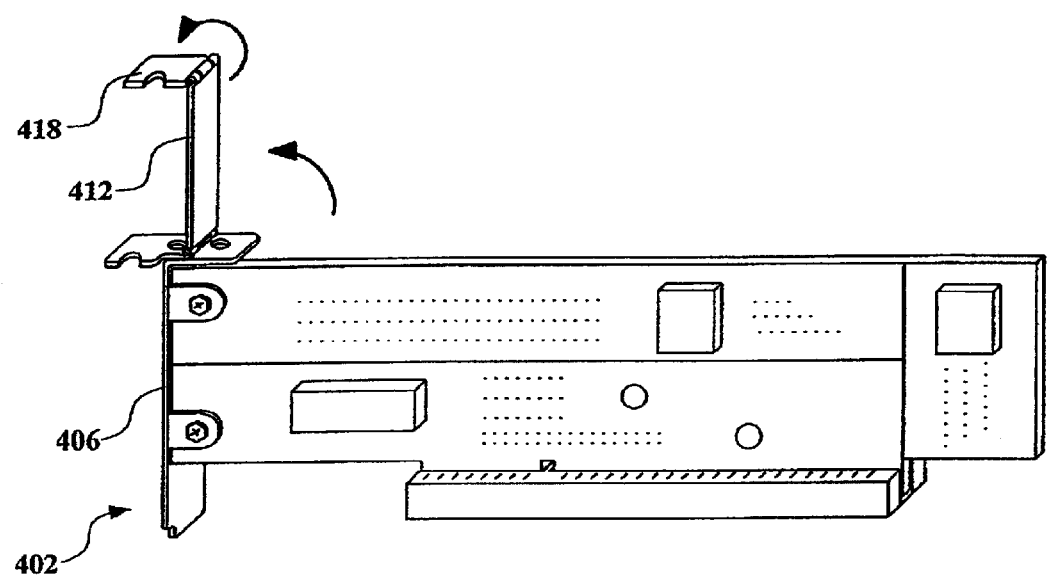
FIG. 4B is a side view of the configurable bracket shown in FIG. 3 arranged in a second configuration.

Referring generally now to FIGS. 4A and 4B, a configurable bracket is shown in a first position for a first specification and a second position for a second specification.

In FIG. 4A, an embodiment of the present invention is shown wherein a configurable bracket is disposed in a first position. The bracket 402 includes an electronic device 408 mounted through the use of connectors 404 arranged generally perpendicular to a bracket member 406. The bracket 402 includes a first extension 410 disposed generally perpendicular to the bracket member 406 for connecting to a chassis of an information handling system. A second extension 412 is connected to the first extension 410 and the bracket member 406.

To secure the second extension 412 in the first configuration, an opening 414 may be provided to enable a screw to connect to an addition 416 of the bracket member 406. Thus, the second extension 412, as well as the third extension 418, may be prevented from causing internal damage to the information handling system. A third extension 418 may also be included, in this instance which is rotatably attached to the second extension 412. By attaching the third extension 418 in the manner, the third extension may be stored generally parallel with the second extension 412, thereby conserving information handling system chassis space.

Therefore, to configure the bracket for mounting in compliance with a second design specification for information handling system devices, the second extension 412 may be rotated to be substantially parallel with the bracket member 406, as shown in FIG. 4B. Additionally, the third extension 418 may be rotated so that it is perpendicular to the second extension 412, to enable the third extension to be connected to an information handling system chassis. The second extension and the bracket may be sized so that the bracket member is of a length corresponding with a first design specification, and the second extension in combination with the bracket member is of a length corresponding to a second design specification. In this way, instead of swapping brackets as previously required, a single bracket may be provided for at least two configurations, thereby saving both time and reducing part count in the assembly of information handling systems. Although the use of hinges is described, it should be apparent that a number of apparatus may be employed without departing from the spirit and scope of the present invention.

Figure 5:
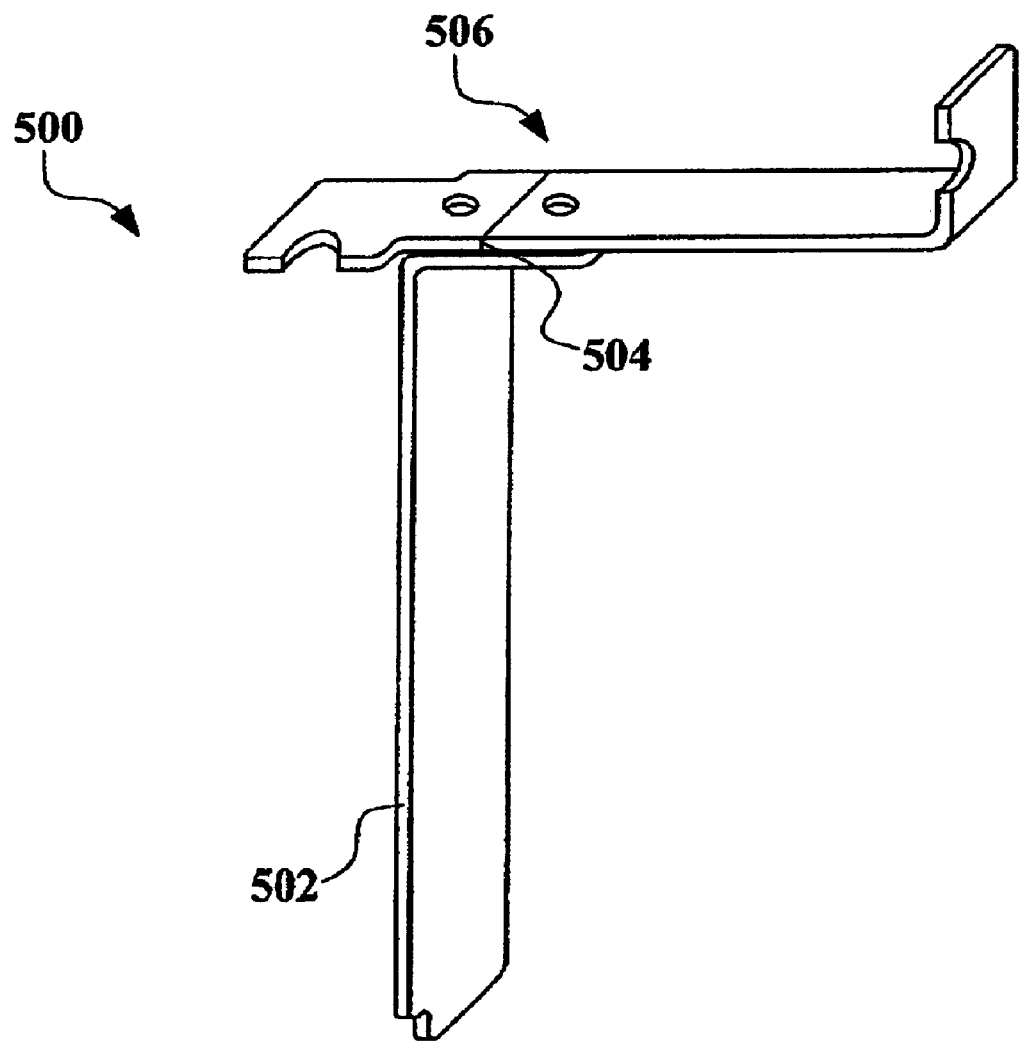
FIG. 5 is an isometric view of an embodiment of the present invention in which a configurable bracket including bend junctions is shown.

For example, referring now to FIG. 5, an embodiment 500 of the present invention is shown wherein a bracket is bendable to attain at least two positions for use in compliance with at least two design specifications. A bracket 502, may be scored, indented, and the like to provide a bend junction 504 at a predefined location to provide the desired length. By providing a bend junction, a securing mechanism for the extensions is not needed, and the bracket may be made in a more efficient and cost effective manner. Additionally, a plurality of bend junctions may be provided, with each bend junction position at a different point along the second extension 506 for each desired specification. It may also be preferable to label the junctions, such as providing an indication on each bend junction, to enable an installer of the configurable bracket a quick and efficient method for configuring a bracket.

It is believed that the bracket of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A configurable bracket for mounting an electronic device within a chassis of an information handling system, comprising:
   a bracket adapted for mounting in a first chassis configuration, the bracket including at least one connection portion suitable for connecting an electronic device to the bracket; and
   an extension suitable for extending said bracket for mounting in a second chassis configuration, and
   a second extension connected to said extension, the second extension suitable for being connected to the chassis of an information handling system in the second chassis configuration, wherein the first chassis configuration is in compliance with a low profile PCI specification and the second chassis configuration is in compliance with a PCI specification.

2. The configurable bracket as described in claim 1, wherein the extension is movable from a stowed position in compliance with the first chassis configuration to a position suitable for engaging a chassis of an information handling system in the second chassis configuration.

3. The configurable bracket as described in claim 2, wherein the extension is at least one of rotatably and bendable connected to the bracket.

4. The configurable bracket as described in claim 1, wherein the bracket is sized to conform to the first chassis configuration and the bracket in combination with the extension is sized to comply with the second chassis configuration.

5. The configurable bracket as described in claim 1, wherein the second extension is at least one of rotatably and bendable connected to the extension extending said bracket for mounting in the second chassis configuration.

6. The configurable bracket as described in claim 1, wherein the bracket includes a bracket member oriented generally perpendicular to an electronic device, configured as a printed circuit board, connected to the at least one connection portion of the bracket, the bracket member adapted for mounting in the first chassis configuration of an information handling system; wherein the extension is suitable for extending the length of said bracket member to enable the bracket to be mounted in the second chassis configuration.

7. The configurable bracket as described in claim 1, wherein a securing device is provided for securing the extension when the bracket is configured for mounting in the first chassis configuration.

8. An apparatus, comprising:
   a configurable bracket suitable for attaining a first position and a second position, wherein the first position is suitable for mounting an electronic device in accordance with a PCI specification and the second position is suitable for mounting an electronic device in accordance with a low profile PCI specification, said configurable bracket including:
   a bracket member;
   an extension, wherein the extension is movable from a stow position in compliance with the low profile PCI specification to a position suitable for engaging a chassis of an information handling system in the PCI specification, and
   a second extension, connected to the extension extending said bracket for mounting, in the second position, the second extension suitable for being connected to a chassis of an information handling system in the PCI specification.

9. The apparatus as described in claim 8, wherein the extension is at least one of rotatably and bendable connected to the bracket member.

10. The apparatus as described in claim 8, wherein a securing device is provided for securing the extension when the bracket is in the first position.

11. The apparatus as described in claim 10, wherein the securing device includes an opening suitably disposed in the second extension and the bracket member includes an addition so that a screw may be disposed through the opening and engage the addition to secure the second extension.

12. The apparatus as described in claim 8, wherein the bracket includes a bracket member oriented generally perpendicular to an electronic device, configured as a printed circuit board, connected to at least one connection portion of the bracket, the bracket member adapted for mounting in the first position of an information handling system; wherein the extension is suitable for extending the length of said bracket member to enable the bracket to be mounted in the second position.

13. A configurable bracket for mounting an electronic device within a chassis of an information handling system, comprising:
   a bracket adapted for mounting in a first chassis configuration, the bracket including at least one connection portion suitable for connecting an electronic device to the bracket; and
   a means for extending connected to the bracket, the extending means suitable for extending said bracket for mounting in a second chassis configuration; and
   a second means for extending, coupled to the means for extending, the second means for extending being suitable for being connected to a chassis of an information handling system in the second chassis configuration, wherein the first chassis configuration is in compliance with a low profile PCI specification and the second chassis configuration is in compliance with a PCI specification.

14. The configurable bracket as described in claim 13, wherein the bracket is sized to conform to the low profile PCI specification and the bracket in combination with the extending means is sized to comply with the PCI specification.

15. The configurable bracket as described in claim 13, wherein the extending means is at least one of rotatably and bendable connected to the bracket member.

16. The configurable bracket as described in claim 13, wherein the extending means is movable from a stowed position to a position suitable for engaging a chassis of an information handling system.

* * * * *